(12) United States Patent
Kawamata et al.

(10) Patent No.: US 9,349,619 B2
(45) Date of Patent: May 24, 2016

(54) PLASMA ETCHING METHOD AND PLASMA ETCHING APPARATUS

(75) Inventors: Masaya Kawamata, Miyagi (JP);
Masanobu Honda, Miyagi (JP);
Kazuhiro Kubota, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/238,552

(22) PCT Filed: Aug. 28, 2012

(86) PCT No.: PCT/JP2012/071723
§ 371 (c)(1),
(2), (4) Date: Feb. 12, 2014

(87) PCT Pub. No.: WO2013/031780
PCT Pub. Date: Mar. 7, 2013

(65) Prior Publication Data
US 2014/0193977 A1   Jul. 10, 2014

Related U.S. Application Data

(60) Provisional application No. 61/534,973, filed on Sep. 15, 2011.

(30) Foreign Application Priority Data

Aug. 31, 2011   (JP) ................. 2011-188600

(51) Int. Cl.
*H01L 21/67* (2006.01)
*H01L 21/3065* (2006.01)
*H01J 37/32* (2006.01)
(Continued)

(52) U.S. Cl.
CPC ..... *H01L 21/67069* (2013.01); *H01J 37/32091* (2013.01); *H01J 37/32449* (2013.01);
(Continued)

(58) Field of Classification Search
CPC ............... H01L 21/3065; H01L 21/67069; H01L 21/67109; H01L 21/67248; H01L 21/6831; H01L 21/31116; H01J 37/32091; H01J 37/32449
See application file for complete search history.

(56) References Cited

U.S. PATENT DOCUMENTS 5,853,484 A     12/1998  Jeong
2008/0078746 A1*  4/2008  Masuda .................... 216/79
(Continued)

FOREIGN PATENT DOCUMENTS

| JP | 2008-047687 | 2/2008 |
| JP | 4358727 | 11/2009 |
| JP | 2010-153680 | 7/2010 |

*Primary Examiner* — Jeffrie R Lund
*Assistant Examiner* — Yuechuan Yu
(74) *Attorney, Agent, or Firm* — IPUSA, PLLC (57) ABSTRACT

A plasma etching apparatus includes a processing chamber; a holding unit for holding the substrate within the processing chamber; an electrode plate facing the holding unit; a plurality of supply parts arranged at different radial positions with respect to the substrate for supplying processing gas to a space between the holding unit and the electrode plate; a high frequency power supply that supplies high frequency power to the holding unit and/or the electrode plate to convert the processing gas supplied to the space into plasma; an adjustment unit that adjusts a supply condition for each of the supply parts; and a control unit that controls the adjustment unit to vary the supply condition between a position where an effect of diffusion of processing gas on an active species concentration distribution at the substrate is dominant and a position where an effect of flow of the processing gas is dominant.

5 Claims, 8 Drawing Sheets

(51) Int. Cl.
*H01L 21/311* (2006.01)
*H01L 21/683* (2006.01)

(52) U.S. Cl.
CPC ...... *H01L21/3065* (2013.01); *H01L 21/31116* (2013.01); *H01L 21/67109* (2013.01); *H01L 21/67248* (2013.01); *H01L 21/6831* (2013.01)

(56) References Cited

U.S. PATENT DOCUMENTS

2011/0220609 A1\* 9/2011 Yaegashi et al. ................. 216/12
2012/0132367 A1\* 5/2012 Tezuka et al. ............ 156/345.33

\* cited by examiner

PLASMA ETCHING METHOD AND PLASMA ETCHING APPARATUS

CROSS-REFERENCE TO RELATED APPLICATIONS

The present application is a National Stage of International Application No. PCT/JP2012/071723 filed on Aug. 28, 2012, claiming priority based on Japanese Patent Application No. 2011-188600 filed on Aug. 31, 2011, and U.S. Provisional Application No. 61/534,973, filed on Sep. 15, 2011, the entire contents of which are hereby incorporated by reference.

TECHNICAL FIELD

The present invention relates to a plasma etching method and a plasma etching apparatus.

BACKGROUND ART

In a semiconductor device manufacturing process, a plasma etching apparatus that etches a substrate such as a semiconductor wafer (simply referred to as "wafer" hereinafter) by irradiating plasma on the wafer may be used as an apparatus for processing the wafer.

In plasma etching, a gas containing fluorine, chlorine, and oxygen, for example, may be used as a processing gas that is turned into plasma. Plasma includes active species such as charged particles (referred to as "ion" hereinafter) and neutral particles (referred to as "radicals" hereinafter), for example. The surface of a wafer reacts with the ions and radicals contained in the plasma to prompt the generation of reaction products, and etching of the wafer progresses as the reaction products are volatized.

In recent years, the diameter of wafer holes are becoming larger. As the wafer hole diameter is enlarged, it becomes increasingly difficult to ensure in-plane uniformity of the depth and line width (critical dimension: CD) of bottom portions of holes (and trenches) within a wafer plane in an etching process.

In this respect, Patent Document 1 discloses a technique for controlling the concentration distribution of radicals at a center region and a peripheral region within a wafer plane by adjusting the supply rate of processing gas supplied from an upper electrode.

Patent Document 1: Japanese Patent No. 4358727

SUMMARY OF THE INVENTION

Problem to be Solved by the Invention

However, because radical diffusion is not uniform at the center region and the peripheral region within a wafer plane, it is difficult to ensure in-plane uniformity with the plasma etching apparatus disclosed in Patent Document 1.

In light of the above problems, one object of the present invention is to provide a plasma etching method and a plasma etching apparatus that can improve in-plane uniformity of the depth and line width of bottom portions of holes (and trenches) within a wafer plane.

Means for Solving the Problem

According to one embodiment of the present invention, a plasma etching apparatus that etches a substrate using a processing gas converted into plasma is provided. The plasma etching apparatus includes a processing chamber; a holding unit that is arranged within the processing chamber and is configured to hold the substrate; an electrode plate that is arranged to face the holding unit within the processing chamber; a plurality of supply parts for supplying processing gas to a space between the holding unit and the electrode plate, the supply parts being arranged at different positions with respect to a radial direction of the substrate; a high frequency power supply that converts the processing gas supplied to the space from the plurality of supply parts into plasma by supplying a high frequency power to at least one of the holding unit and the electrode plate; an adjustment unit that adjusts a supply condition for supplying processing gas with respect to each of the plurality of supply parts; and a control unit that controls the adjustment unit to vary the supply condition to be adjusted between a first position and a second position. The first position is where an effect of diffusion of supplied processing gas is greater than an effect of flow of supplied processing gas on an active species concentration distribution of active species contained in the plasma-converted processing gas at the substrate, and the second position is where the effect of flow of supplied processing gas is greater than the effect of diffusion of supplied processing gas on the active species concentration distribution at the substrate.

Advantageous Effect of the Invention

According to an aspect of the present invention, a plasma etching method and a plasma etching apparatus that can improve in-plane uniformity of the depth and line width at bottom portions of holes (and trenches) within a wafer plane may be provided.

DESCRIPTION OF REFERENCE NUMERALS

10, W wafer
105 susceptor (holding unit)
106 temperature distribution adjustment unit
120 upper electrode (electrode plate)

122 belows
130 gas supply condition adjustment unit (adjustment unit)
140 shower head
143 buffer chamber
145 annular partition wall member
150 gas supply device
190 device control unit
200 upper electrode drive unit (gap adjustment unit)

EMBODIMENTS FOR IMPLEMENTING THE INVENTION

Figure 1:
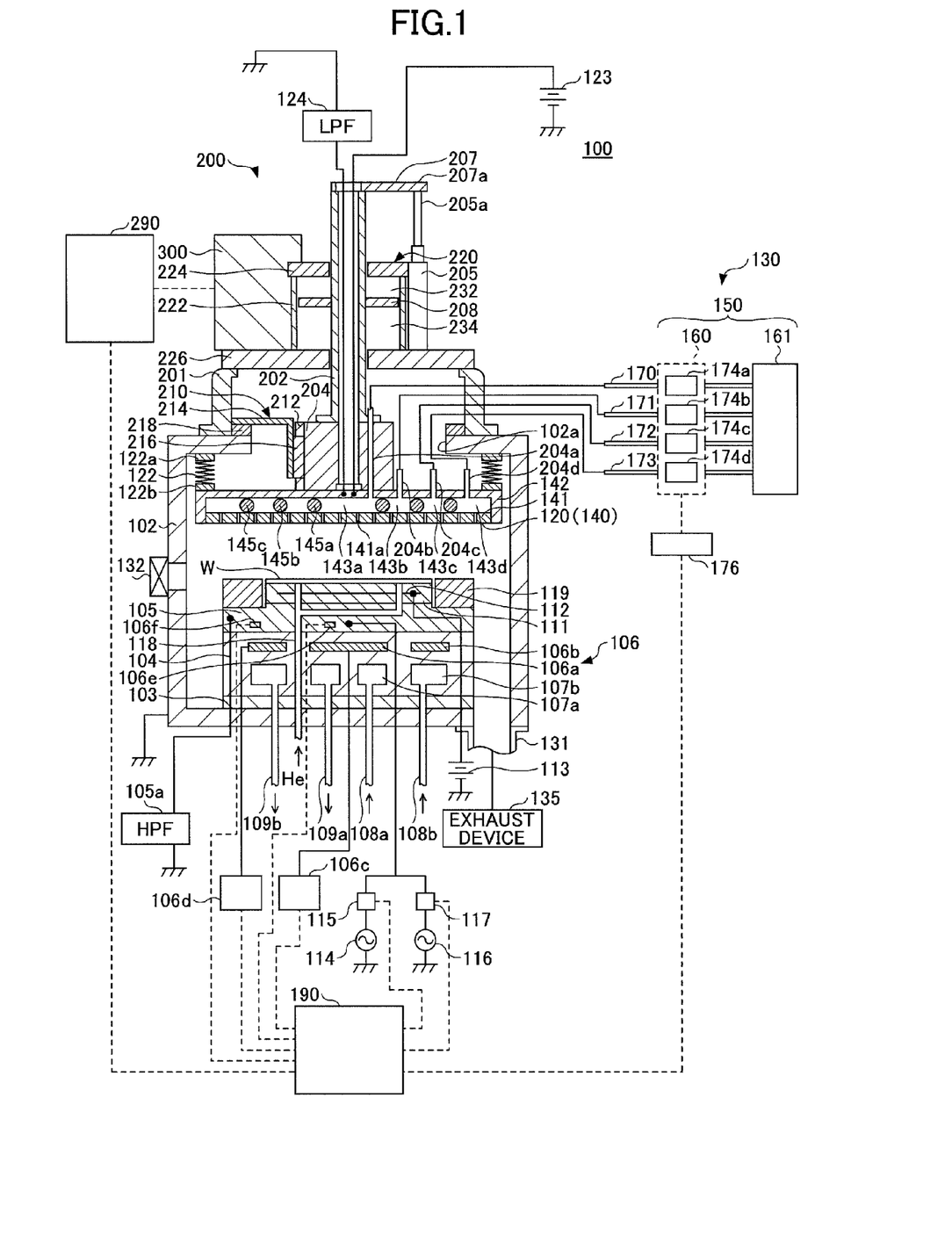
FIG. 1 illustrates an exemplary configuration of a plasma etching apparatus according to an embodiment of the present invention.
Figure 2:
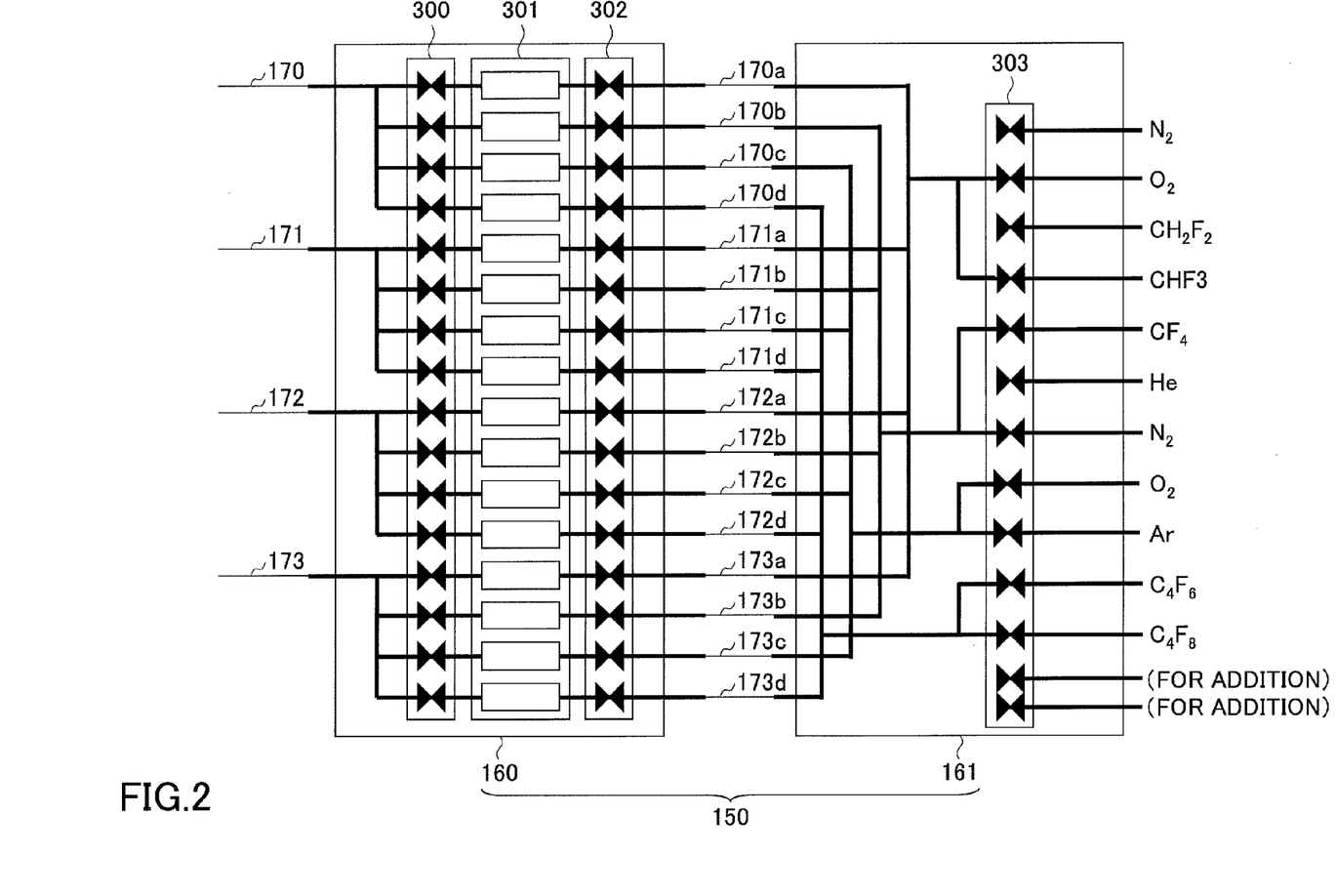
FIG. 2 illustrates an exemplary configuration of a gas supply device of the plasma etching apparatus illustrated in FIG. 1.

In the following, embodiments of the present invention are described with reference to the accompanying drawings.
(Plasma Etching Apparatus Configuration)
First, an exemplary configuration of a plasma etching apparatus according to an embodiment of the present invention is described with reference to FIG. 1.
FIG. 1 schematically illustrates an exemplary configuration of a plasma etching apparatus according to an embodiment of the present invention. FIG. 2 schematically illustrates an exemplary configuration of a gas supply device 150 of the plasma etching apparatus of FIG. 1. Note that the illustration of the gas supply device 150 in FIG. 1 is simplified, and the gas supply device 150 is described in greater detail in FIG. 2.
The plasma etching apparatus 100 of the present embodiment is a parallel plate type plasma etching apparatus.
The plasma processing apparatus 100 includes a cylindrical chamber (processing chamber) 102 made of aluminum having an alumite-treated (anodized) surface, for example. The chamber 102 is grounded.
A substantially cylindrical susceptor support 104 is arranged at a bottom portion within the chamber 102 via an insulating plate 103 made of ceramic, for example. A susceptor 105 corresponding to a lower electrode is arranged on the susceptor support 104. A high pass filter (HPF) 105a is connected to the susceptor 105.
The susceptor 105 has an upper side center portion arranged into a convex circular plate shape. An electrostatic chuck 111 having substantially the same shape as a wafer W corresponding to a processing object is arranged on this circular plate shaped portion. The electrostatic chuck 111 is made of an insulating material and has an electrostatic electrode 112 interposed between the insulating material. The electrostatic chuck 111 is a circular plate shaped ceramic member, and the electrostatic chuck 112 is connected to a DC power supply 113.
When a positive DC voltage is supplied to the electrostatic chuck 112, a negative electric potential is generated at a face of the wafer W toward the electrostatic chuck 111 (referred to as "backside" of the wafer W hereinafter). In this way, a difference in potential is created between the electrostatic chuck 112 and the backside of the wafer W. The wafer W is electrostatically attracted to the electrostatic chuck 111 by a Coulomb force or a Johnsen-Rahbek force that is generated as a result of such a difference in potential. At this point, a DC voltage of 1.5 kV, for example, may be supplied to the electrostatic chuck 111 from the DC power supply 113 connected to the electrostatic electrode 112.
A first high frequency power supply 114 and a second high frequency power supply 116 are connected to the susceptor 105 via a first matching unit 115 and a second matching unit 117, respectively. The first high frequency power supply 114 supplies to the susceptor 105 a high frequency power for biasing having a relatively low frequency of 13.6 MHz, for example. The second high frequency power supply 115 supplies to the suceptor 105 a high frequency power for plasma generation having a relatively high frequency of 40 MHz, for example. In this way, the susceptor 105 can supply power for plasma generation within the chamber 102.

A gas passageway 118 for supplying a heat transfer medium (e.g., backside gas such as He gas) to the backside of the wafer W is arranged to extend through the insulating plate 103, the susceptor support 104, the susceptor 105, and the electrostatic chuck 111. Heat may be exchanged between the suceptor 105 and the wafer W via such a heat transfer medium so that the wafer W may be maintained at a predetermined temperature.

An annular focus ring 119 is arranged on an upper edge portion of the susceptor 105 to surround the wafer W that is placed on the electrostatic chuck 111. The focus ring 119 may be made of a dielectric material such as ceramic or quartz, or a conductive material such as a single crystal silicon. For example, the focus ring 119 may be made of the same conductive material as the wafer W.

By expanding a plasma distribution range to the focus ring 119, the plasma density at a periphery portion of the wafer W may be maintained substantially the same as the plasma density at a center portion of the wafer W. In this way, plasma etching uniformity within a wafer plane may be improved.

An upper electrode 120 is arranged to face the susceptor 105 and be substantially parallel to the susceptor 105. The upper electrode 120 is connected to a DC power supply 123. The upper electrode 120 is also connected to a low pass filter (LPF) 124.

The upper electrode 120 may be driven by an upper electrode drive unit 200 to move in the vertical direction, for example. By arranging the upper electrode 120 to be movable in the vertical direction, a distance between the upper electrode 120 and the susceptor 105 (referred to as "gap G" hereinafter) may be adjusted. As described below in connection with a plasma etching method according to an embodiment of the present invention, the gap G is a parameter that has a substantial effect on the diffusion and flow of processing gas. Accordingly, as described in detail below, by enabling adjustment of the gap G, the plasma distribution at a space between the upper electrode 120 and the susceptor 105 within the chamber 102 may be controlled.

The displacement of the upper electrode 120 that is driven by the upper electrode drive unit 200 is not particularly limited. For example, the displacement of the upper electrode 120 may be 70 mm, and the gap G may be adjusted to be within a range of 20 mm to 90 mm. However, the present invention is not limited to such an example. Also, the orientation of the plasma etching apparatus 100 is not limited to that illustrated in FIG. 1. For example, the plasma etching apparatus 100 of FIG. 1 may be turned 90 degrees or turned upside down.

The upper electrode 120 is supported by an upper inner wall of the chamber 102 via bellows 122. The bellows 122 are attached by fixing means such as bolts to the upper inner wall of the chamber 102 via an annular upper flange 122a. Also, the bellows 122 are attached by fixing means such as bolts to the surface of the upper electrode 120 via an annular upper flange 122b.

In the following, the upper electrode drive unit 200 for adjusting the gap G is described. The upper electrode drive unit 200 includes a substantially cylindrical support member 204 that supports the upper electrode 120. The support member 204 is attached to an upper center portion of the upper electrode 120 by fixing means such as a bolt.

The support member 204 is arranged to be movable in and out of a hole 102a formed around a center portion of an upper wall of the chamber 102. An outer peripheral face of the support member 204 is supported by a slide mechanism 210 inside the hole 102a of the chamber 102.

The slide mechanism 210 includes a fixing member 214 that is L-shaped in cross section, a guide member 216 that is fixed to a vertical portion of the fixing member 214 at an upper part of the chamber 102, and a rail part 212 arranged in one direction (vertical direction in the present example) on the outer peripheral face of the support member 204 to be slidably supported by the guide member 216.

The fixing member 214 that fixes the guide member 216 of the slide mechanism 210 is fixed to the upper part of the chamber 102 via a horizontal adjustment plate 218 having an annular horizontal portion. A horizontal positioning of the upper electrode 120 may be adjusted by the horizontal adjustment plate 218.

The horizontal adjustment plate 218 may be fixed to the chamber 102 by bolts that are arranged equidistantly around the horizontal adjustment plate 218, for example. A tilt of the horizontal adjustment plate 218 with respect to the horizontal direction may be adjusted by adjusting how much the bolts are protruding, for example. By adjusting the tilt of the horizontal adjustment plate 218 with respect to the horizontal direction and adjusting a tilt of the guide member 216 of the slide mechanism 210 with respect to the vertical direction, a tilt of the upper electrode 120 in the horizontal direction may be adjusted. That is, the upper electrode 120 may be constantly maintained horizontal.

An air pressure cylinder 220 for driving the upper electrode 120 is attached to the upper side of the chamber 102 via a cylindrical body 201. That is, the bottom edge of the cylindrical body 201 is hermetically sealed to the upper side of the chamber 102 by bolts, for example, to cover the hole 102a. The top edge of the cylindrical body 201 is hermetically sealed to the bottom edge of the air pressure cylinder 220.

The air pressure cylinder 220 includes a rod 202 that may be driven to move in one direction. The bottom end of the rod 202 may be connected to an upper center portion of the support member 204 b a bolt, for example. When the rod 202 is driven, the upper electrode 120 is driven by the support member 204 to move along the slide mechanism 210. The rod 202 may have a cylindrical structure, for example, and an internal space of the rod 202 communicates with a center hole formed at a center portion of the support 204 and is released to the atmosphere. In this way, wiring that is grounded via the upper electrode 120 and the low pass filter (LPF) 124, and a power supply line for supplying a DC voltage to the upper electrode 120 from the DC power supply 123 may be connected to the upper electrode 120 via the internal space of the rod 202 and the center hole of the support member 204.

Also, a position detector such as a linear encoder 205 for detecting the position of the upper electrode 120 is arranged at a side of the air pressure cylinder 220. A top end member 207 including an extending portion 207a extending sideways from the rod 202 is arranged at the top end of the rod 202. The extending portion 207a of the top end member 207 and a position detection unit 205a of the linear encoder 205 are arranged to be in contact with each other. The top end member 207 moves in conjunction with the upper electrode 120. Thus, the linear encoder 205 may detect the position of the upper electrode 120.

The air pressure cylinder 220 includes a cylinder main body 222, an upper support plate 224, and a lower support plate 226. The cylinder main body 222 is interposed between the upper support plate 224 and the lower support plate 226. An annular partition member 208 for partitioning the internal space of the air pressure cylinder 220 into an upper space 232 and a lower space 234 is arranged around an outer peripheral face of the rod 202.

Compressed air is introduced into the upper space 232 of the air pressure cylinder 220 from an upper port 236 of the upper support plate 224. Compressed air is introduced into the lower space 234 of the air pressure cylinder 220 from a lower port 238 of the lower support plate 226. By controlling the amount of air introduced into the upper space 232 and the lower space 234 from the upper port 236 and the lower port 238, the rod 202 may be driven and controlled to move in one direction (e.g., vertical direction). The amount of air introduced into the air pressure cylinder 220 is controlled by an air pressure circuit 300 arranged near the air pressure cylinder 220.

The upper electrode drive unit 200 also includes a control unit 290, which is connected to a device control unit 190. A control signal from the device control unit 190 is transmitted to the control unit 290, and in turn, the control unit 290 controls drive operations of various components of the upper electrode drive unit 200.

A temperature distribution adjustment unit 106 for adjusting an in-plane temperature distribution of the wafer W is arranged within the susceptor support 104. The temperature distribution adjustment unit 106 includes heaters 106a and 106b, heater power supplies 106c and 160d, thermometers 106e and 106f, and coolant paths 107a and 107b.

The susceptor support 104 has the heater 106a arranged at the center side and the heater 106b arranged at the outer side. The center side heater 106a is connected to the center side heater power supply 106c, and the outer side heater 106b is connected to the outer side heater power supply 106d. The center side heater power supply 106c and the outer side heater power supply 106d are capable of independently adjusting the power supplied to the center side heater 106a and the outer side heater 106b, respectively. In this way, a temperature distribution may be created at the susceptor support 104 and the susceptor 105 along the radial direction of the wafer W. That is, the temperature distribution along the radial direction of the wafer W may be adjusted.

Also, the susceptor support 104 has the thermometer 106e arranged at the center side and the thermometer 106f arranged at the outer side. The center side thermometer 106e and the outer side thermometer 106f measure temperatures of the susceptor support 104 at the center side and the outer side, respectively. In this way, the center side thermometer 106e and the outer side thermometer 106f may derive temperatures at the center side and the outer side of the wafer W. The temperatures measured by the center side thermometer 106e and the outer side thermometer 106f are transmitted to the device control unit 190. The device control unit 190 adjusts outputs of the center side heater power supply 106c and the outer side heater power supply 106d so that the temperatures of the wafer W derived from the measured temperatures reach their target temperatures.

The susceptor support 104 may also have the coolant path 107a arranged at the center side and the coolant path 107b arranged at the outer side. The center side coolant path 107a and the outer side coolant path 107b may be arranged to circulate coolants such as cooling water or fluorocarbon coolants at different temperatures, for example. To circulate the coolants, a coolant is introduced into the coolant path 107a via a center side introduction pipe 108a and is discharged via a center side discharge pipe 109a. Also, a coolant is introduced into the outer side coolant path 107b via an outer side introduction pipe 108b and is discharged via an outer side discharge pipe 109b.

The temperature of the susceptor 105 is adjusted through heating by the heaters 106a and 106b, and cooling by the coolants. Accordingly, the wafer W is adjusted to a predetermined temperature by heat from plasma radiation and irradiation of ions included in the plasma, and heat exchange with the susceptor 105. Note that because the susceptor support 104 has the center side heater 106a (and center side coolant path 107a) and the outer side heater 106b (and outer side coolant path 107b), the temperatures of the wafer W at the center side and the outer side may be independently adjusted.

Also, although not illustrated in FIG. 1, a heat insulating layer such as a heat insulating material or a space may be provided between the center side heater 106a and the outer side heater 106b or the center side coolant path 107a and the outer side coolant path 107b. By providing such a heat insulating layer, heat insulation may be achieved between the center side heater 106a and the outer side heater 106b or the center side coolant path 107a and the outer side coolant path 107b. That is, a greater heat distribution may be created between the center side and the outer side of the wafer W.

An exhaust pipe 131 is connected to a bottom portion of the chamber 102, and an exhaust device 135 is connected to the exhaust pipe 131. The exhaust device 135 includes a vacuum pump such as a turbo-molecular pump for adjusting the internal pressure within the chamber 102 to a reduced-pressure atmosphere (e.g., 0.67 Pa or lower). Also, a gate valve 132 is arranged at a side wall of the chamber 102. The gate valve 132 may be opened to allow the wafer W to be transferred into and out of the chamber 102. Note that a transfer arm may be used to transfer the wafer W, for example.

(Configuration of Adjustment Unit for Adjusting Processing Gas Supply Conditions)

In the following, referring to FIGS. 2 and 3, an exemplary configuration of a gas supply condition adjustment unit 130 for adjusting gas supply conditions for supplying plasma gas to the wafer W supported by the susceptor 105 is described. Note that the gas supply condition adjustment unit 130 is an exemplary embodiment of a plurality of supply parts for supplying processing gas and an adjustment unit for adjusting a supply condition for supplying processing gas with respect to each of the plurality of supply parts.

FIG. 2 illustrates an exemplary configuration of the gas supply device 150 of the plasma etching apparatus of FIG. 1. FIG. 3 illustrates an exemplary configuration of the shower head 140 of the plasma etching apparatus of FIG. 1.

The gas supply condition adjustment unit 130 includes the shower head 140, which is integrated with the upper electrode 120, and the gas supply device 150.

The shower head 140 is configured to spray a predetermined processing gas (e.g., mixed gas) on the wafer W that is held by the susceptor 105. The shower head 140 includes a circular electrode plate 141 (upper electrode 120) having multiple gas spray holes and an electrode support 142 that detachably supports an upper face (front side) of the electrode plate 141. The electrode support 142 is arranged into a circular disk shape having the same diameter as the electrode plate 141. A circular buffer chamber 143 is formed within the electrode support 142. The electrode plate 141 has gas spray holes for supplying gas such as processing gas to the wafer W (referred to as "gas spray holes 141x" hereinafter, with x being variable).

Figure 3:
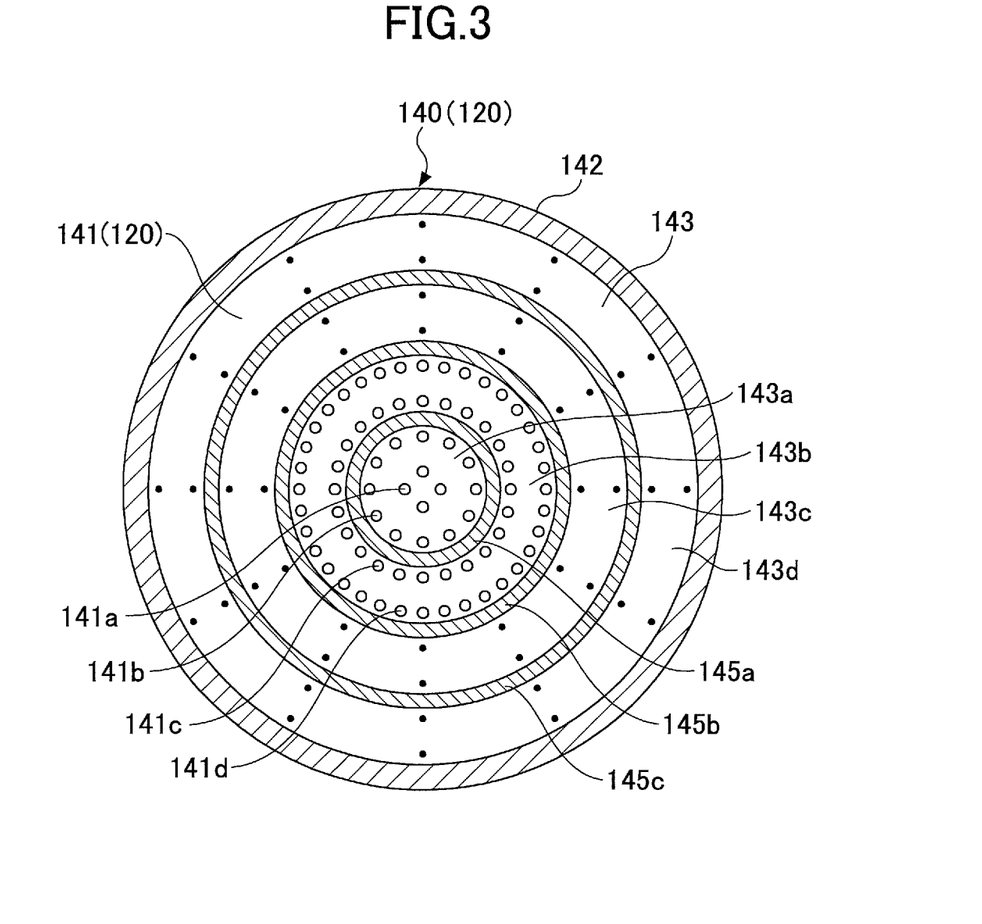
FIG. 3 illustrates an exemplary configuration of a shower head of FIG. 1.

As illustrated in FIG. 3, the buffer chamber 143 has one or more annular partition wall members 145 forming O-rings. The annular partition wall members 145 are arranged at different positions with respect to the radial direction of the shower head 140. In FIG. 3, a first annular partition wall member 145a, a second annular partition wall member 145b, and a third annular partition wall member 145c are concentrically arranged from the center side to the periphery side with respect to the radial direction of the shower head 140. In this way, the buffer chamber 143 is divided into a first buffer chamber 143a, a second buffer chamber 143b, a third buffer chamber 143c, and a fourth buffer chamber 143d from the center side to the periphery side.

The number of annular partition wall members 145 arranged within the buffer chamber 143 is not particularly limited as long as at least one is provided. For example, three may be provided as illustrated in FIG. 3. In a case of performing plasma etching using a wafer W with a diameter of 300 mm, three annular partition wall members 145 are preferably provided (i.e., the buffer chamber 143 is preferably divided into four zones) for facilitating control of the processing gas and securing in-plane etching uniformity at the same time by the plasma etching method described below. Note that by providing N annular partition wall members 145, the buffer chamber 143 may be divided into N+1 buffer chambers.

The gas supply device 150 supplies a predetermined processing gas to the first through fourth buffer chambers 143a, 143b, 143c, and 143d.

One or more gas spray holes 141x are arranged to communicate with the first through fourth buffer chambers 143a, 143b, 143c, and 143d at the bottom side of the buffer chamber 143. A predetermined processing gas may be sprayed on the wafer W via these gas spray holes 141x. The number and layout of the gas spray holes 141x are preferably arranged such that processing gas may be evenly sprayed on the wafer W.

In the following, an exemplary layout of the gas spray holes 141x is described in a case where a wafer W with a diameter of 300 mm is used and the buffer chamber 143 is divided into four zones by three annular partition wall members 145. In this case, the first buffer chamber 143a has four gas spray holes 141a arranged (e.g., equidistantly) along the circumference of a 11-mm-radius circle with its center point at the center of the shower head 140, and twelve gas spray holes 141b arranged (e.g., equidistantly) along the circumference of a 33-mm-radius circle with its center point the center of the shower head 140. The second buffer chamber 143b has twenty-four (24) gas spray holes 141c arranged (e.g., equidistantly) along the circumference of a 55-mm-radius with its center point the center of the shower head 140, and thirty-six (36) gas spray holes 141d arranged (e.g., equidistantly) along the circumference of a 77-mm-radius circle with its center point at the center of the shower head 140. The third buffer chamber 143c has forty-eight (48) gas spray holes (not shown) arranged (e.g., equidistantly) along the circumference of a 99-mm-radius circle with its center point at the center of the shower head 140, and sixty (60) gas spray holes (not shown) arranged (e.g., equidistantly) along the circumference of a 121-mm-radius circle with its center point at the center of the shower head 140. The fourth buffer chamber 143d has eighty (80) gas spray holes (not shown) arranged (e.g., equidistantly) along the circumference of a 143-mm-radius circle with its center point at the center of the shower head 140, and one hundred (100) gas spray holes (not shown) arranged (e.g., equidistantly) along the circumference of a 165-mm-radius circle with its center point at the center of the shower head 140.

In the following, referring to FIG. 2, a valve mechanism and a flow rate adjustment mechanism of the gas supply device 150 for individually supplying processing gas to the buffer chambers are described. Note that FIG. 2 also illustrates an exemplary case where the buffer chamber 143 is divided into four zones by three annular partition wall members 145. However, the present invention is not limited to such an example.

The gas supply device 150 includes a first gas box 161 and a second gas box 160. The first gas box 161 accommodates a plurality of gas supply sources and a first valve 303. The second gas box accommodates a second valve 302, a flow rate controller 301 such as a mass flow controller, and a third valve 303.

In the present embodiment, the gas supply sources include fluorocarbon-based fluorine compound (CF) processing gases such as $CF_4$ gas, $C_4F_6$ gas, $C_4F_8$ gas, $CH_2F_2$ gas, and $CHF_3$ gas, for example. Also, the gas supply sources include gas for controlling adhesion of reaction products of the CF gases such as oxygen ($O_2$) gas. Further, the gas supply sources include carrier gases such as Ar gas, $N_2$ gas, and He gas, for example.

In the first gas box 161, the gas supply sources are connected to pipes. The pipes are arranged into a branching structure so that each gas from the gas supply sources may be supplied to each of the buffer chambers. In the example illustrated in FIG. 2, pipes 170-173 each branch out into four branches at the gas supply source side. Also, the pipes are connected to the first valve 303 so that gases to be supplied may be switched according to a desired process. With such a structure, a new gas supply source may be added or the supply of a processing gas that may not be needed for a process may be stopped, for example, through simple operations.

The pipes 170-173 are connected to the first through fourth buffer chambers via the second gas box 160, and a predetermined processing gas may be supplied to each of the buffer chambers.

The second gas box 160 accommodates a second valve 302, a flow rate controller (or mass flow controller) 301, and a third valve 300 arranged in this order from the gas supply source side. The second valve 302, the third valve 300, and the flow rate controller 301 are arranged at each of a plurality of pipes for supplying different types of gas to the buffer chambers. In this way, in addition to adjusting the flow rate of processing gas supplied to a specific buffer chamber from the gas supply sources, a supply of a specific processing gas may be stopped by closing a specific valve so that the processing gas may only be supplied to a specific buffer chamber (i.e., a specific zone).

The branches of the pipes 170-173 merge at the downstream side of the third valve 300 so that a mixed processing gas may be supplied to each of the first through fourth buffer chambers. Note that although not shown, additional valves may be arranged at the downstream side of the merging points of the processing gases, and in this way, whether to supply the processing gas to each buffer chamber may be controlled by opening/closing each of the valves.

The second gas box 160 may also include a pressure gauge as a pressure adjustment unit (not shown) and an additional valve, and the flow rate of processing gas may be controlled based on the measurement result of the pressure gauge, for example.

Operations of the flow rate controller 301 within the second gas box 160 may be controlled by the device control unit 190 of the plasma etching apparatus 100, for example. Accordingly, the device control unit 190 may start/stop the supply of different types of gasses from the first gas box 161 and the second gas box and control the amount of the gases supplied.

As described above, the plasma etching apparatus 100 includes the device control unit 190. The device control unit 190 includes a processing unit such as a CPU (not shown) and a recording medium such as a hard disk (not shown). The device control unit 190 controls operations of units including the first high frequency power source 114, the second high frequency power source 116, the temperature distribution adjustment unit 106, the upper electrode drive unit 200, and the gas supply condition adjustment unit 130, for example. To control the operations of the above units, the CPU of the device control unit 190 may implement corresponding programs stored in the hard disk of the device control unit 190 for prompting the units to execute an etching process, for example.

Note that the device control unit 190 is an exemplary embodiment of a control unit of the present invention.

(Plasma Etching Method)

In the following, an exemplary plasma etching method using the above plasma etching apparatus 100 is described.

When gas is supplied from the gas spray holes to a space between the upper electrode 120 and the susceptor 105, the gas is diffused while being flown in an exhaust gas flow direction (direction toward the exhaust device 135). Depending on the gas spray hole position, for example, the effect of "flow" or the effect of "diffusion" on the concentration distribution of gas components (e.g., radicals) transported may vary. The Peclet number is a dimensionless number that qualitatively indicates the degree of dependency on the "diffusion" or "flow". The Peclet number may be expressed by Formula (1) indicated below, where u represents the gas velocity (m/s), $D_{AB}$ represents the interdiffusion coefficient of gases (m²/s), and L represents the characteristic length (m).

$$Pe = uL/D_{AB} \tag{1}$$

When the Peclet number is less than one (1), the effect of "diffusion" is greater than the effect of "flow" on gas transportation. When the Peclet number is greater than one (1), the effect of "flow" is greater than the effect if "diffusion" on gas transportation.

Figure 4:
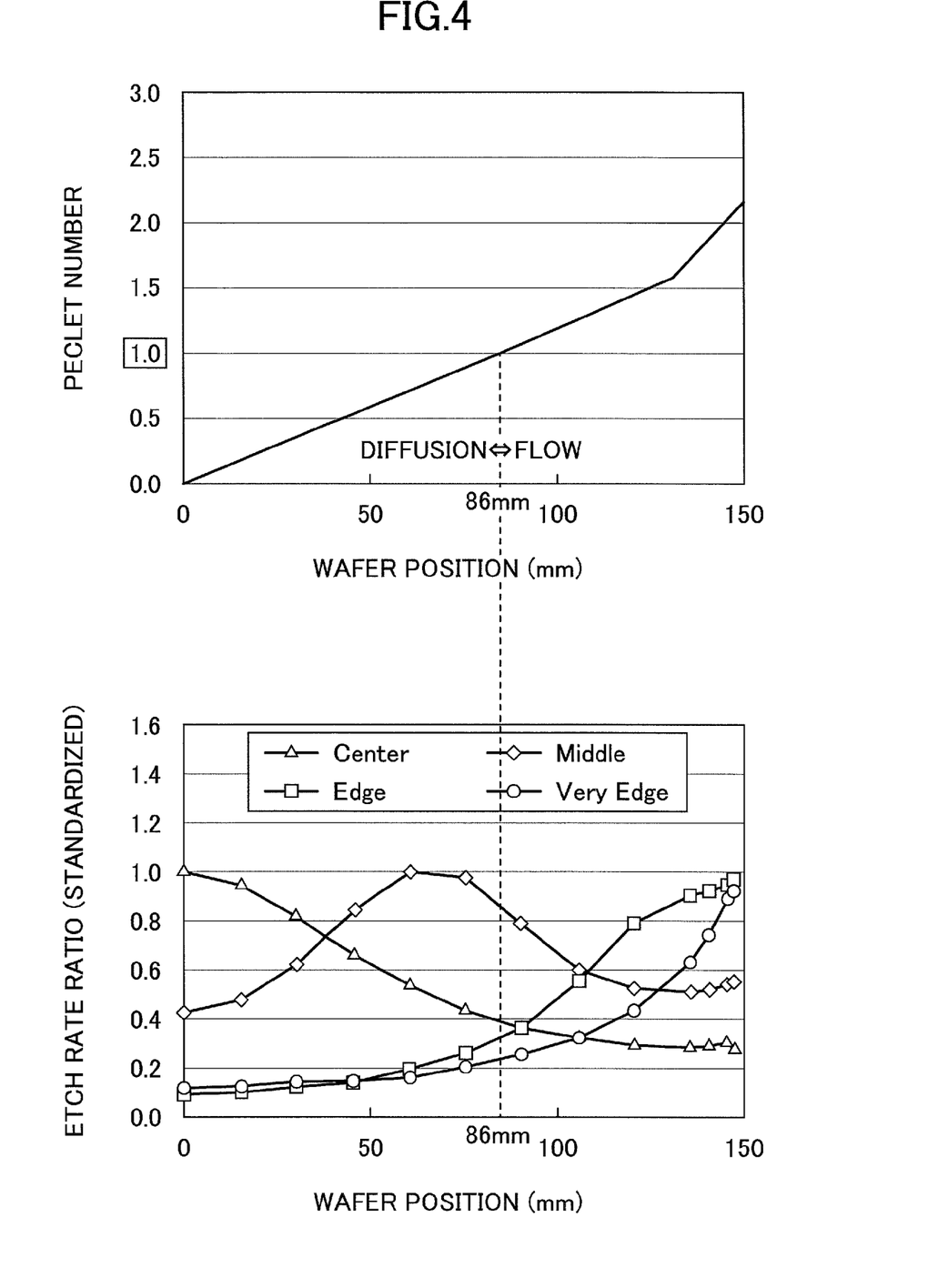
FIG. 4 illustrates the Peclet number at radial positions of a wafer in an embodiment of the present invention.

As one specific example, FIG. 4 includes a graph indicating the Peclet number at different radial positions on a wafer in the present embodiment (see upper graph of FIG. 4). The upper graph of FIG. 4 indicates a Peclet number obtained by calculating the velocity u in a case where a gas mixture of Ar gas and $C_4F_8$ gas (interdiffusion coefficient $D_{AB}=1.23\times10^{-1}$ m²/s) is used and the characteristic length L (i.e., gap G between the susceptor 105 and the upper electrode 120) is 0.03 m. Note that in the graph of FIG. 4 indicating the Peclet number, the horizontal axis represents radial positions of a 300-mm-diameter wafer with the center of the wafer set equal to 0 mm.

It can be appreciated from the upper graph of FIG. 4 that the wafer is divided into a region where the effect of "diffusion" is greater than the effect of "flow" and a region where the effect of "flow" is greater than the effect of "diffusion" at a 86-mm radial position with respect to the center of the wafer.

Also, FIG. 4 includes a graph indicating etch rate ratios at various wafer positions in a case where a 300-mm-diameter wafer is used (see lower graph of FIG. 4). Specifically, the lower graph of FIG. 4 indicates an etch rate ratio at a wafer position in a case where the buffer chamber is divided into four zones (i.e., "Center", "Middle", "Edge", and "Very Edge" zones) by three annular partition wall members and plasma etching is performed on a 300-mm-diameter wafer by spraying gas from each of these zones. Note that in the present example, four (4) gas spray holes arranged along the circumference of a 11-mm-radius circle around the center of the shower head and twelve (12) gas spray holes arranged along the circumference of a 33-mm-radius circle around the center of the shower head are provided at the "Center" zone. Twenty-four (24) gas spray holes arranged along the circumference of a 55-mm-radius circle around the center of the shower head and thirty-six (36) gas spray holes arranged along the circumference of a 77-mm-radius circle around the center of the shower head are provided at the "Middle" zone. Forty-eight (48) gas spray holes arranged along the circumference of a 99-mm-radius circle around the center of the shower head and sixty (60) gas spray holes arranged along the circumference of a 121-mm-radius circle around the center of the shower head are provided at the "Edge" zone. Eighty (80) gas spray holes arranged along the circumference of a 143-mm-radius circle around the center of the shower head and one hundred (100) gas spray holes arranged along the circumference of a 165-mm-radius circle around the center of the shower head are provided at the "Very Edge" zone. The following descriptions relating to supplying gas from the "Center", "Middle", "Edge", and "Very Edge" zones refer to supplying gas from the above gas spray holes arranged at the respective zones.

Note that the vertical axis of the lower graph of FIG. 4 represents a standardized etch rate ratio with the etch rate of a maximum etch rate position set equal to one (1).

According to the lower graph of FIG. 4, in cases where gas is supplied from the "Center" zone and the "Middle" zone, the etch rate is higher at positions corresponding to the positions where gas is supplied. This is because at the "Center" and "Middle" zones, the effect of "diffusion" is greater than the effect of "flow" on gas transportation (see upper graph of FIG. 4). Also, it is believed that gas supplied from the "Center" and "Middle" zones also affect the etch rates at the "Edge" zone and the "Very Edge" zone.

On the other hand, in cases where gas is supplied from the "Edge" zone and the "Very Edge" zone, the effect of supplied gas on the etch rate is shifted to the outer side. That is, because the effect of "flow" of the supplied gas is greater than the effect "diffusion" on gas transportation at the "Edge" (and "Very Edge") zone (see upper graph of FIG. 4), gas supplied from the "Edge" zone is believed to flow toward the periphery. Note that gas supplied from the "Edge" zone and the "Very Edge" zone has very little impact on the etch rate at the "Center" and "Middle" zones.

Based on the above, in controlling the supply of processing gas, it is important to vary the gas supply condition to be adjusted between a position where the effect of diffusion of supplied processing gas is greater than the effect of flow, and a position where the effect of flow of supplied processing gas is greater than the effect of diffusion. That is, with respect to the position where the effect of diffusion of supplied processing gas is greater than the effect of flow, a gas supply condition of gas spray holes corresponding to (right above) this position may be adjusted, and with respect to the position where the effect of flow of supplied processing gas is greater than the effect of diffusion, a gas supply condition of gas spray holes located toward the center with respect to this position may be adjusted to improve in-plane uniformity upon plasma etching. For example, based on the values u, L, and $D_{AB}$, if the effect of diffusion is greater than the effect of flow of processing gas supplied from the "Edge" (or "Very Edge") zone, a gas supply condition for supplying processing gas from the "Edge" (or "Very Edge") zone may be adjusted, and if the effect of flow is greater than the effect of diffusion, a gas supply condition for supplying processing gas from the "Center" (or "Middle") zone may be adjusted.

In the following, the effects of gas supply conditions on gas transportation are described. That is, the impact of supply gas parameters on the in-plane etching uniformity of a wafer is described.

Diffusion of supply gas depends on the mean free path l (m) of diffusion molecules (gas molecules) and the gas flow rate u (m/s). Assuming the supply gas is in an ideal gas state and the Maxwell distribution applies to the molecular speed of the diffusion molecules, the mean free path l of the diffusion molecules may be expressed by Formula (2) indicated below.

$$l = (T \times C_1)/(d^2 \times P) \quad (2)$$

In the above Formula (2), $C_1$ represents a constant, d represents the molecular collision diameter (m) of the diffusion molecules, P represents the pressure in the system, and T represents the temperature (K) in the system.

Also, assuming the supply gas is in an ideal gas state, the supply gas flow rate u may be expressed by Formula (3) indicated below.

$$u = (Q \times C_2)/PV \quad (3)$$

In the above Formula (3), $C_2$ represents a constant, Q represents the flow rate ($m^3/s$) at 1 atmosphere, P represents the pressure in the system, and V represents the volume ($m^3$) in the system In this case, because a supply gas diffusion area $d_{area}$ is proportionate to the ratio of the mean free path l to the flow rate u (l/u), Formula (4) indicated below may be derived from Formula (2) and Formula (3).

$$d_{area} \propto l/u = (T \times V \times C_3)/(d^2 Q) \quad (4)$$

In the above Formula (4), $C_3$ represents a constant.

It can be appreciated from the above that the supply gas diffusion area depends on the volume in the system, the supply gas flow rate, the temperature in the system, and the molecular collision diameter. Note that the volume in the system approximates the volume of the space between the upper electrode 120 and the susceptor 105 in the present embodiment, and because the diameter of a processing object does not change during plasma etching, the distance of the space between the upper electrode 120 and the susceptor 105 (gap G) may be used to represent this parameter. Also, the supply gas flow rate has a correlation with the pressure in the system. Further, because the molecular collision diameter depends on the type of supply gas (i.e., molecular weight of the supply gas), the supply gas diffusion area may also depend on the molecular weight of the supply gas.

In the following, referring to FIGS. 5-8, experiments are described that indicate how the supply gas diffusion area depends on parameters (supply conditions) such as the supply gas flow rate (and supply gas pressure), the supply gas molecular weight, and the gap G.

Figure 5:
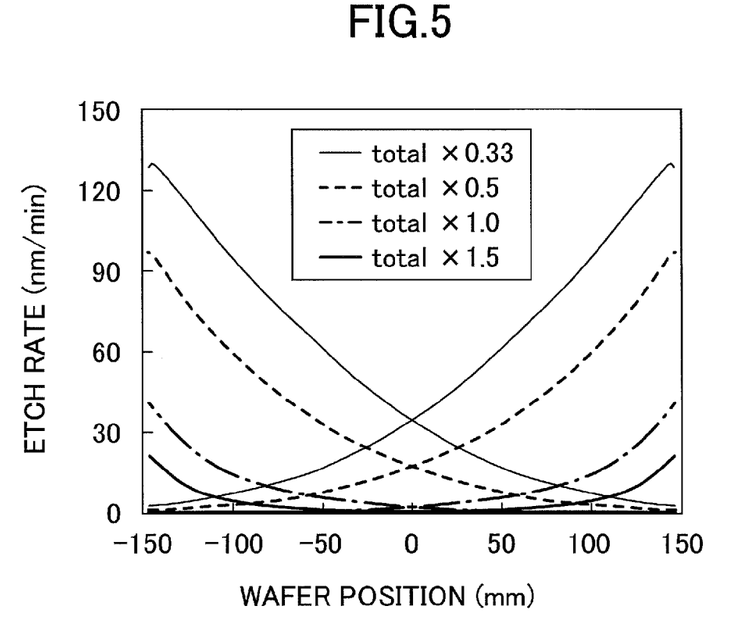
FIG. 5 illustrates an example of a change in the etch rate when a processing gas supply condition is altered.
Figure 6:
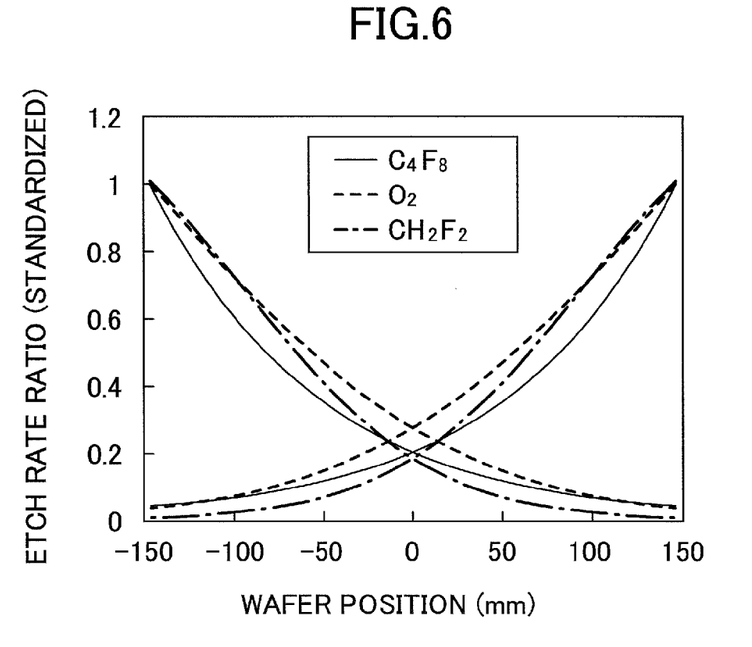
FIG. 6 illustrates another example of a change in the etch rate when a processing gas supply condition is altered.
Figure 7:
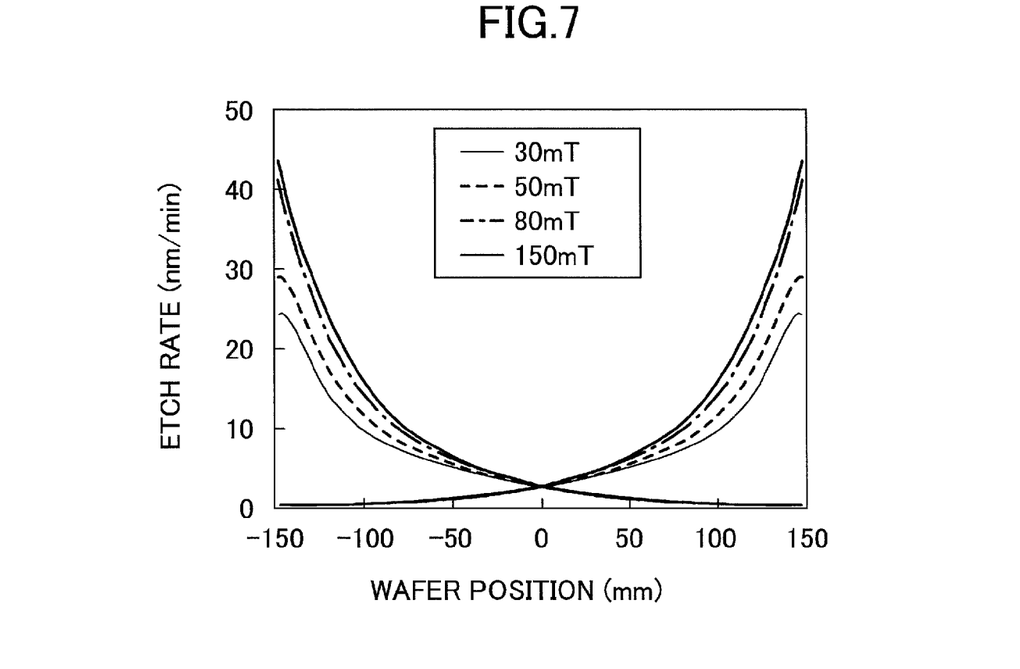
FIG. 7 illustrates another example of a change in the etch rate when a processing gas supply condition is altered.
Figure 8:
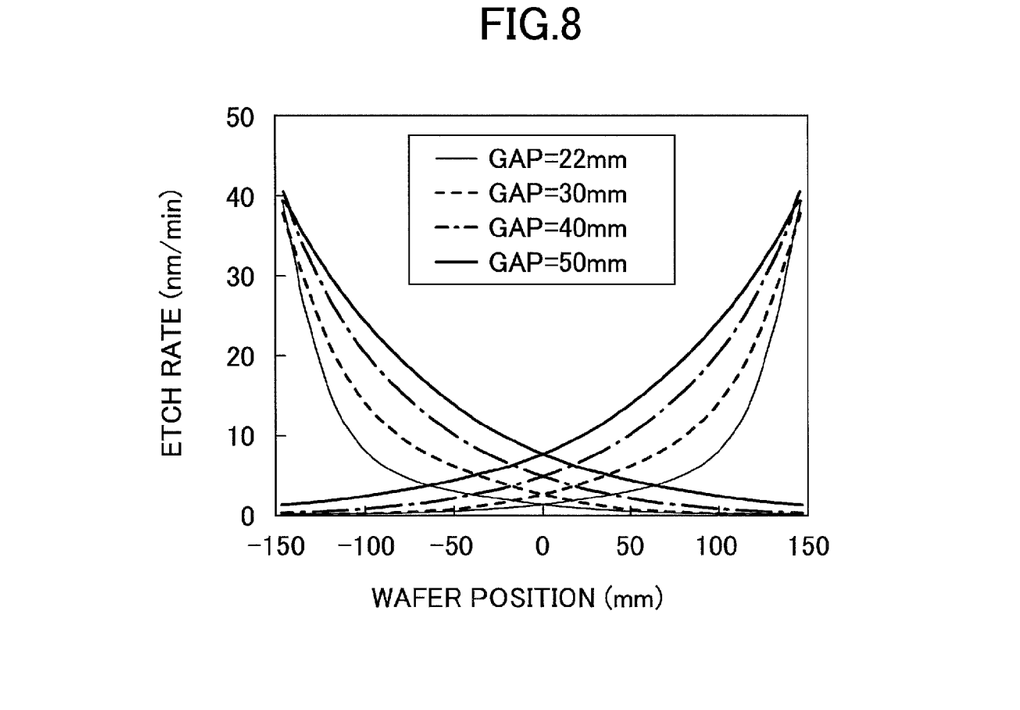
FIG. 8 illustrates another example of a change in the etch rate when a processing gas supply condition is altered.

FIG. 5 illustrates an example of a change in the etch rate when a processing gas supply condition is changed. FIG. 6 illustrates another example of a change in the etch rate when a processing gas supply condition is changed. FIG. 7 illustrates another example of a change in the etch rate when a processing gas supply condition is changed. FIG. 8 illustrates another example of a change in the etch rate when a processing gas supply condition is changed. Note that the supply condition subject to change corresponds to the supply gas flow rate in FIG. 5, the supply gas pressure in FIG. 6, the supply gas molecular weight in FIG. 7, and the gap G in FIG. 8. Also, as with the previously described examples, the buffer chamber was divided into four zones ("Center", "Middle", "Edge", and "Very Edge") by three annular partition wall members, and the partial pressure of gas supplied from the gas spray holes was arranged to be constant (see description of etching conditions below). Further, additional gas was supplied from gas spray holes arranged along the outermost circle at the "Very Edge" zone (165-mm radius circle around the center of the shower head) under the conditions indicated below, and the etch rates at various wafer positions were plotted under these conditions. Note that the vertical axis of FIG. 5 represents the etch rate of silicon oxide at a BEOL (Back End of Line) trench pattern formed on a processing object including a silicon wafer with silicon oxide deposited thereon as a hard mask.

The vertical axis of FIG. 6 represents a standardized etch rate ratio with the etch rate of a maximum etch rate position (outermost position) set equal to 1.

Detailed etching conditions are indicated below.

| Etching apparatus internal pressure | 80 mTorr (Pressure change range: 30-150 mTorr) |
|---|---|
| Gap G | 30 mm (Gap change range: 22-50 mm) |
| High frequency power supply power (40 MHz/13 MHz) | 700/1000 W |
| Upper electrode potential | 0 V |
| Processing gas flow rate (total pressure) | $C_4F_8/Ar/N_2/O_2$ = 30/1200/70/17 sccm (Additional $C_4F_8$ ($O_2$ or $CH_2F_2$ upon molecular weight change) at 20 sccm supplied to outermost position; Flow rate change range: 0.33-1.5 times the above flow rate) |
| Processing time | 60 seconds |

It can be appreciated from the graphs plotting the etch rates in FIGS. 5-8 how each of the parameters affects the diffusion of supply gas. For example, by decreasing the supply gas flow rate, decreasing the supply gas molecular weight, increasing the pressure in the system, and increasing the gap G, the supply gas may be diffused to a greater extent. In other words, by controlling these parameters, the concentration distribution of gas (i.e., radicals) may be controlled, and in this way, in-plane uniformity of a wafer plane shape may be improved upon performing plasma etching.

(Experiments Confirming Effects of Plasma Etching Apparatus and Plasma Etching Method of Present Embodiment)

In the following, experiments confirming the effects of the plasma etching apparatus and plasma etching method of the present embodiment are described with reference to FIGS. 9 and 10.

Figure 9:
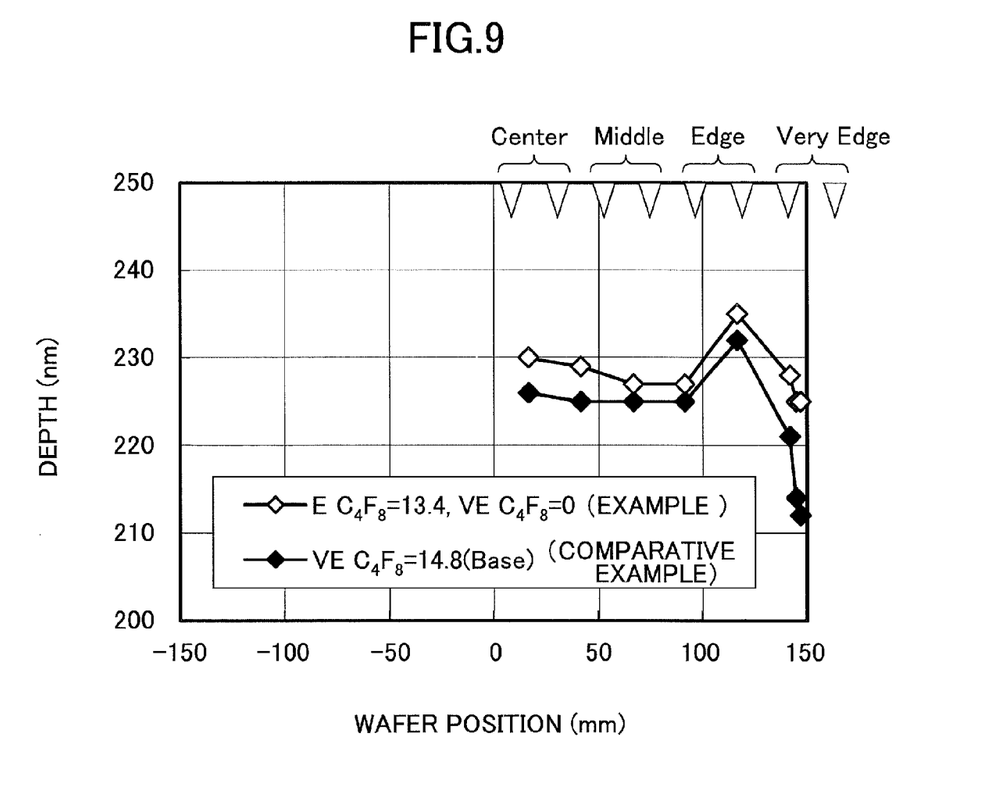
FIG. 9 illustrates how the depth of a trench may be controlled under plasma etching conditions according to an example of the present embodiment and a comparative example.
Figure 10:
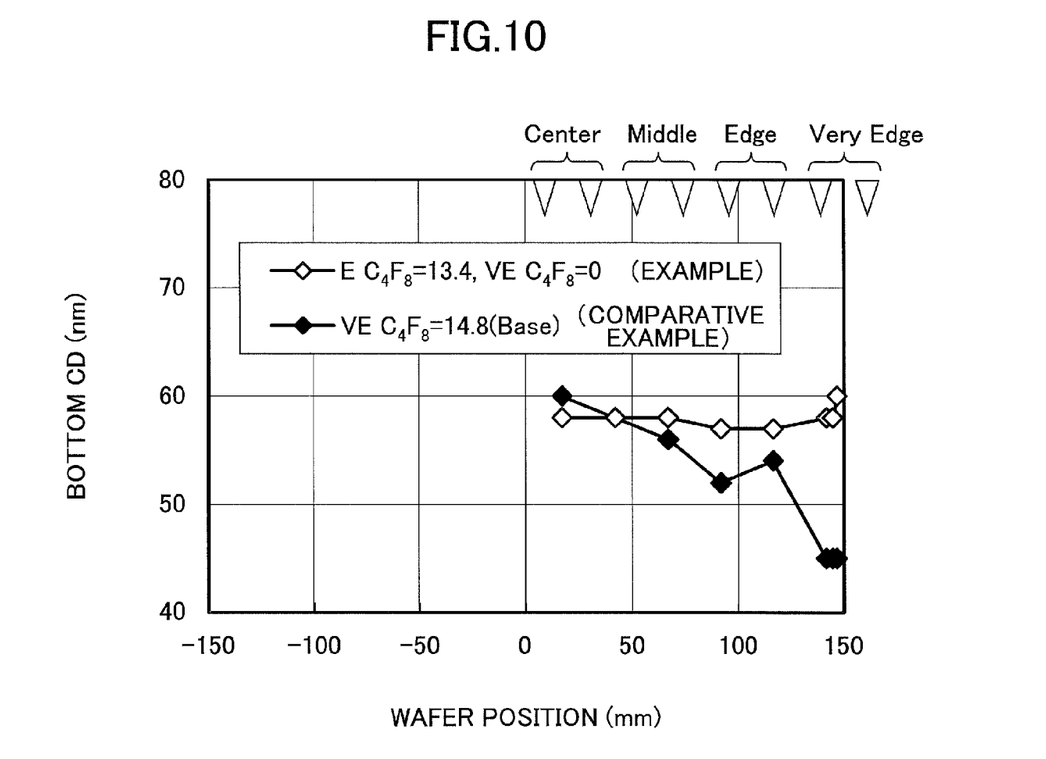
FIG. 10 illustrates how the bottom critical dimension of a trench may be controlled under plasma etching conditions according to an example of the present embodiment and a comparative example.

FIG. 9 illustrates an exemplary manner of how the depth of a line portion and the line width of a bottom portion (bottom CD) can be controlled to achieve substantial uniformity under plasma etching conditions according to an example of the present embodiment and plasma etching conditions according to a comparative example. FIG. 10 illustrates another exemplary manner of how the depth of a line portion and the line width of a bottom portion (bottom CD) can be controlled to achieve substantial uniformity under plasma etching conditions according to an example of the present embodiment and plasma etching conditions according to a comparative example. As with the previously-described examples, the buffer chamber was divided into four zones ("Center", "Middle", "Edge", and "Very Edge") by three annular partition wall members. In the comparative example, the partial pressure (see description of etching conditions below) of gas supplied from the gas spray holes was arranged to be constant. In the example of the present embodiment, the partial pressure of processing gas ($C_4F_8$) supplied from the gas spray holes at the "Edge" zone was increased, and the partial pressure of processing gas ($C_4F_8$) supplied at the "Very Edge" zone was set equal to zero (0). Note that the vertical axes of the graphs shown in FIGS. 9 and 10 represent the trench depth and the bottom CD of a BEOL (Back End of Line) trench pattern formed by depositing a silicon oxide on a silicon wafer as a hard mask and etching the silicon wafer.

Detailed etching conditions are indicated below.

<<Common>>

| Etching apparatus internal pressure | 80 mTorr |
|---|---|
| Gap G | 30 mm |
| High frequency power supply power (40 MHz/13 MHz) | 400/200 W |
| Upper electrode potential | 700 V |
| Processing time | 95 seconds |

<<Processing Gas Flow Rate of Example>>
(Note that the partial pressure from gas spray holes is maintained constant within each zone)

| "Center" zone partial pressure total | $C_4F_8/Ar/N_2/O_2$ = 1.3/53/3.1/1.0 sccm |
|---|---|
| "Middle" zone partial pressure | $C_4F_8/Ar/N_2/O_2$ = 4.9/198/12/3.8 sccm |
| "Edge" zone partial pressure | $C_4F_8/Ar/N_2/O_2$ = 13.4/356/21/6.8 sccm |
| "Very Edge" zone partial pressure | $C_4F_8/Ar/N_2/O_2$ = 0/593/35/11 sccm |

<<Processing Gas Flow Rate of Comparative Example>>
(Note that the partial pressure from gas spray holes is maintained constant throughout all the zones)

| "Center" zone partial pressure total | $C_4F_8/Ar/N_2/O_2$ = 1.3/53/3.1/1.0 sccm |
|---|---|
| "Middle" zone partial pressure | $C_4F_8/Ar/N_2/O_2$ = 4.9/198/12/3.8 sccm |
| "Edge" zone partial pressure | $C_4F_8/Ar/N_2/O_2$ = 8.9/356/21/6.8 sccm |
| "Very Edge" zone partial pressure | $C_4F_8/Ar/N_2/O_2$ = 14.8/593/35/11 sccm |

As can be appreciated from FIG. 9, in the case where the partial pressure of processing gas supplied from the gas spray holes is maintained constant throughout all the gas spray holes as in the comparative example, the trench depth within a wafer plane has a variation of 20 nm. That is, the in-plane depth substantially decreases at the "Very Edge" zone in the comparative example. On the other hand, in the case where the partial pressure at the "Edge" zone is increased and the partial pressure at the "Very Edge" zone is decreased as in the example of the present embodiment, the in-plane depth variation is 10 nm. That is, the in-plane depth at the "Very Edge" zone may be controlled to be substantially the same as the in-plane depth at the "Center" zone and the "Middle" zone meaning in-plane uniformity of the in-plane depth can be improved. Also, as can be appreciated from FIG. 10, in the case where the partial pressure of processing gas supplied from the gas spray holes is maintained constant throughout all the gas spray holes as in the comparative example, the in-plane bottom CD variation is 15 nm. However, in the case where the partial pressure at the "Edge" zone is increased and the partial pressure at the "Very Edge" zone is decreased as in the example of the present embodiment, the in-plane bottom CD variation may be reduced to 3 nm meaning in-plane uniformity of the in-plane bottom CD can be improved.

As described above with reference to FIG. 4, when gas is supplied from the "Very Edge" zone, the effect of supplied gas on the etch rate is shifted toward the periphery. That is, in this zone, the effect of "flow" is greater than the effect of "diffusion" on gas transportation and gas supplied from the "Very Edge" zone flows further outward. By increasing the amount of gas supplied from the "Edge" zone, which is at the inner side of the "Very Edge" zone, the etch rate at the "Very Edge" zone may be increased and in-plane uniformity of the in-plane depth may be improved as a result.

Although the present invention is described above with reference to certain illustrative embodiments, the present invention not limited to these embodiments but includes numerous variations and modifications that may be made without departing from the scope of the present invention. For example, a processing object to be etched by the plasma etching apparatus of the present invention is not particularly limited. In one specific example, a wafer made of a silicon substrate and having a silicon dioxide ($SiO_2$) film, an etching film made of a polysilicon film, a single-layer or multi-layer mask film, a BARC (Bottom Anti-Reflective Coating) film, and a photo resist film formed thereon may be used. In this case, the resist film may be exposed and developed beforehand to have a predetermined pattern formed thereon.

The present application is based on and claims the benefit of priority of Japanese Patent Application No. 2011-188600 filed on Aug. 31, 2011, and U.S. Provisional Application No. 61/534,973 filed on Sep. 15, 2011, the entire contents of which are herein incorporated by reference.

The invention claimed is:

1. A plasma etching apparatus that etches a substrate using a processing gas converted into plasma, the plasma etching apparatus comprising: a processing chamber;
  a holding unit that is arranged within the processing chamber and is configured to hold the substrate;
  an electrode plate that is arranged to face the holding unit within the processing chamber;
  a plurality of supply parts for supplying processing gas to a space between the holding unit and the electrode plate, the supply parts being arranged at different positions with respect to a radial direction of the substrate;
  a high frequency power supply that converts the processing gas supplied to the space from the plurality of supply parts into plasma by supplying a high frequency power to at least one of the holding unit and the electrode plate;
  an adjustment unit that adjusts at least one of an amount of the processing gas and species of the processing gas with respect to each of the plurality of supply parts; and
  a control unit that controls the adjustment unit to vary said at least one of the amount of the processing gas and the species of the processing gas between a first position and a second position, the first position being where an effect of diffusion of supplied processing gas is greater than an effect of flow of supplied processing gas on an active species concentration distribution of active species contained in the plasma-converted processing gas at the substrate, and the second position being where the effect of flow of supplied processing gas is greater than the effect of diffusion of supplied processing gas on the active species concentration distribution at the substrate,
  wherein the plurality of supply parts include a first supply part for supplying processing gas to a center portion of the substrate that is toward a radial center of the substrate and a second supply part for supplying processing gas to a substrate portion that is toward a radial periphery of the substrate with respect to the center portion;
  wherein the control unit controls the adjustment unit to adjust a first supply condition including at least one of an amount of the processing gas and species of the processing gas from the first supply part if the effect of flow is greater than the effect of diffusion on the active species concentration distribution at the substrate portion where the processing gas is supplied from the second supply part,
  wherein the control part controls the adjustment unit to adjust a second supply condition including at least one of an amount of the processing gas and species of the processing gas from the second supply part if the effect of diffusion is greater than the effect of flow on the active species concentration distribution at the substrate portion where the processing gas is supplied from the second supply part;
  wherein the control part includes a non-transitory memory unit configured to store a program and a central processing unit configured to perform the program so as to calculate a Peclet number calculated by $uL/D$ where $u$ denotes a processing gas flow rate and $D$ denotes a processing gas diffusion coefficient at the substrate portion where the processing gas is supplied from the second supply part, and $L$ denotes a distance between the holding unit and the electrode plate,
  wherein the effect of diffusion is greater than the effect of flow in a case where the Peclet number is less than one; and
  wherein the effect of flow is greater than the effect of diffusion in a case where the Peclet number is greater than one.

2. The plasma etching apparatus as claimed in claim 1, wherein the first supply condition and the second supply condition correspond to a processing gas supply flow rate.

3. The plasma etching apparatus as claimed in claim 1, wherein
  the first supply part includes a first supply hole formed at a first portion of a plurality of portions into which a space above the electrode plate is subdivided concentrically by ring spacers with respect to a center position of the electrode plate and facing the center of the substrate held by the holding unit, the first supply part being configured to supply processing gas to the space via the first supply hole; and
  the second supply part includes a second supply hole formed at a second portion toward the radial periphery of the substrate with respect to the first portion of the plurality of portions, the second supply part being configured to supply processing gas to the space via the second supply hole.

4. The plasma etching apparatus as claimed in claim 3, further comprising:
  an electrode support plate that is arranged at a side of the electrode plate opposite the holding unit and is configured to support the electrode plate; wherein
  the first supply part and the second supply part respectively include a first buffer chamber and a second buffer chamber that are formed inside the electrode support plate or between the electrode support plate and the electrode plate, the first buffer chamber and the second buffer chamber being subdivided concentrically with respect to the center position of the electrode plate and facing the center of the substrate held by the holding unit;
  the first supply hole communicates with the first buffer chamber; and the second supply hole communicates with the second buffer chamber.

5. The plasma etching apparatus as claimed in claim 4, wherein the first buffer chamber and the second buffer chamber are separate without being connected.

* * * * *